(12) United States Patent
Luettermann et al.

(10) Patent No.: US 8,077,471 B2
(45) Date of Patent: Dec. 13, 2011

(54) PRESSURE GUIDE FOR PCB

(75) Inventors: Dieter Luettermann, Rahden (DE); Guenter Pape, Enger (DE)

(73) Assignee: Harting Electronics GmbH & Co. KG (DE)

( * ) Notice: Subject to any disclaimer, the term of this patent is extended or adjusted under 35 U.S.C. 154(b) by 373 days.

(21) Appl. No.: 11/769,577

(22) Filed: Jun. 27, 2007

(65) Prior Publication Data
US 2008/0013261 A1   Jan. 17, 2008

(30) Foreign Application Priority Data

Jul. 13, 2006  (DE) .................. 20 2006 010 806 U

(51) Int. Cl.
*H05K 5/00* (2006.01)
(52) U.S. Cl. .................. 361/753; 361/756; 361/757
(58) Field of Classification Search .............. 361/755, 361/753, 756, 757
See application file for complete search history.

(56) References Cited

U.S. PATENT DOCUMENTS

| 34,190 A * | 1/1862 | Rubinstein | 417/477.5 |
|---|---|---|---|
| 4,619,490 A | 10/1986 | Hawkings | 339/31 |
| 5,467,254 A | 11/1995 | Brusati et al. | 361/799 |
| 5,617,296 A * | 4/1997 | Melville et al. | 361/736 |
| 5,827,084 A * | 10/1998 | Biernath | 439/262 |
| 6,249,936 B1 * | 6/2001 | Webster | 24/569 |
| 6,767,232 B1 * | 7/2004 | Tien | 439/159 |

FOREIGN PATENT DOCUMENTS

| DE | 299 12 419 U1 | 7/1999 |
|---|---|---|
| JP | 48-44453 | 6/1973 |
| JP | 59-164296 | 9/1984 |

OTHER PUBLICATIONS

Two (2) Official Actions issued in Applicants' corresponding Chinese Patent Application Serial No. 200710129138.1.
An Official Action issued in Applicants' corresponding Canadian Patent Application Serial No. 2,593,216.
German Search Report dated Apr. 16, 2007.

* cited by examiner

*Primary Examiner* — Nabil El Hady
*Assistant Examiner* — Abiy Getachew
(74) *Attorney, Agent, or Firm* — Hayes Soloway P.C.

(57) ABSTRACT

A pressure guide for an electric connection between strip conductors on a circuit board and electric contacts arranged in an edge connector is provided. The pressing device aligns a circuit board guided between two guide bars by a spring element arranged in the one of the guide bars, such that the electric strip conductors applied on the circuit board exactly conform to the contacts arranged within the edge connector.

8 Claims, 5 Drawing Sheets

PRESSURE GUIDE FOR PCB

BACKGROUND OF THE INVENTION

1. Field of the Invention

The invention pertains to a pressure guide for a printed circuit board that can be inserted between two guide bars in a circuit board connector housing in order to achieve precise contacting of the strip conductors applied to the circuit board with corresponding electric contacts arranged in an edge connector.

A device of this type is required for ensuring the exact mechanical locating of contact decks arranged on a circuit board relative to electric contacts located in an edge connector.

2. Description of the Related Art

General direct plug-and-socket connections between circuit boards and circuit board connectors provided for this purpose hardly cause any tolerance problems between the contacts on the circuit board and the electric contacts within the connector due to the relatively large contact spacing (>1 mm).

However, if the contact spacing is reduced, increased precision is required in the manufacture of the circuit boards such that the costs are inevitably increased. Otherwise, the relatively broad manufacturing tolerances of conventional circuit boards make it difficult to prevent mismating between the contacts on the circuit board and the exactly located contacts in the connector.

SUMMARY OF THE INVENTION

Consequently, the invention is based on the objective of realizing a device of the initially cited type in such a way that the best mechanical conformity possible is achieved between the position of the contact decks on the circuit board and the contacts in the edge connector, namely with consideration of the broad fault tolerances in the manufacture of circuit boards.

This objective is attained by providing a spring element that acts upon the narrow side of the circuit board within one of the guide bars.

The advantages attained with the invention can be seen, in particular, in that the relatively broad dimensional tolerances that apparently cannot be reduced in the manufacture of the connecting region on a circuit board are minimized by means of the inventive spring element to such a degree that it is also possible to precisely contact socket contacts in the edge connector that are arranged within small distances of one another.

Mismated contacts or, in extreme instances, short circuits are unavoidable if the contacts of the circuit board are not exactly located relative to the socket contacts.

This is the case, in particular, if the connecting region of a circuit board is inserted into the mating slot of an edge connector and the circuit board is not definitively located relative to the connector. The reason for this can be seen in that dimensional tolerances also apply to the longitudinal direction of the slot. However, if a contact spacing of <1 mm is required, the strict tolerances on both sides of the mating region can no longer be guaranteed by the manufacturers of circuit boards.

In order to be inserted into the edge connector, both sides of the circuit board are held in a guide bar that, in turn, is snapped into a circuit board connector housing or said housing features a bottom plate and a cover plate with protruding guide webs, in which the circuit board is located similar to guide bars.

The precise locating of the circuit board in an edge connector requires a strict tolerance between the first contact deck on the circuit board and the contact edge in the edge connector.

To this end, the edge connector is adjusted to a minimal height tolerance referred to one of the two guide bars, between which the circuit board is located.

The spring element arranged in the second guide bar has a spring arm that is oriented in the mating direction of the circuit board.

During the insertion of the circuit board, the spring element exerts pressure upon the narrow side of the circuit board such that a circuit board that previously could be loosely inserted between the guide bars is inserted into the edge connector in an exactly located fashion shortly before the strip conductors are contacted with the electric contacts.

In this case, the spring element is arranged in one of the guide bars in the form of an integral or separate element that may be realized in the form of a plastic part or a metal part.

BRIEF DESCRIPTION OF THE DRAWINGS

One embodiment of the invention is illustrated in the figures and described in greater detail below. The figures show:

FIG. 4b shows a detail of the spring element according to FIG. 4a;

DESCRIPTION OF THE PREFERRED EMBODIMENTS

Figure 1:
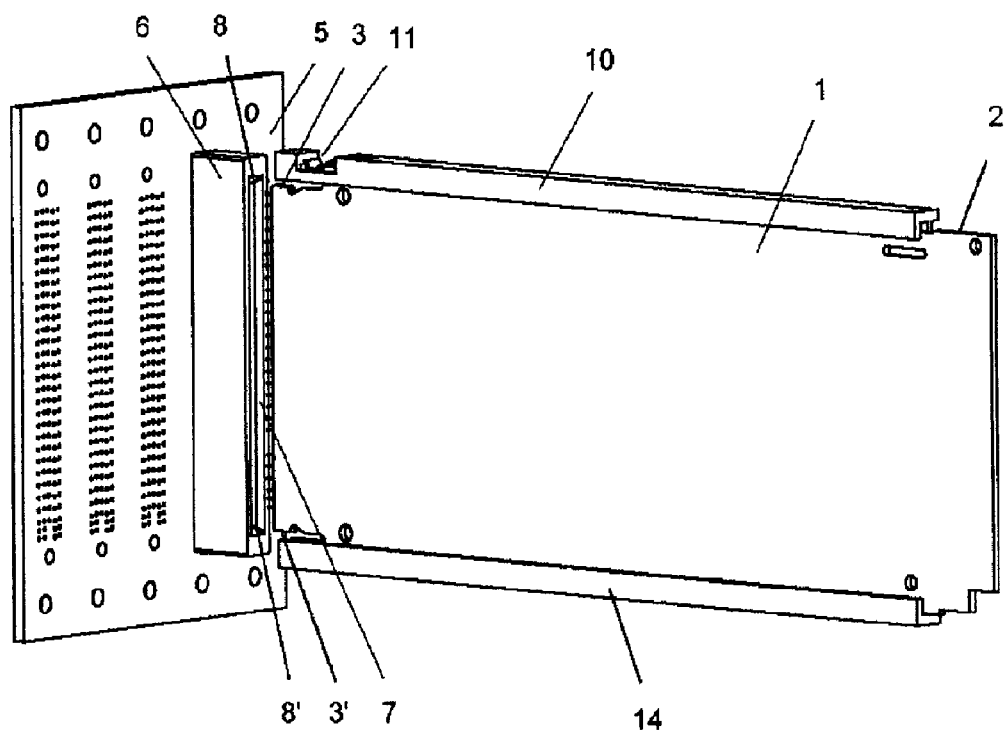
FIG. 1 shows an aspect of a backplane with an edge connector and a circuit board arranged between the guide bars before the mating process.

FIG. 1 shows an arrangement for directly mating a circuit board 1 with an edge connector 6 that is fixed on a so-called backplane 5.

The circuit board 1 is inserted between two guide bars 10, 14 that are usually mounted on a not-shown cover plate or bottom plate or on corresponding support bars.

Figure 2:
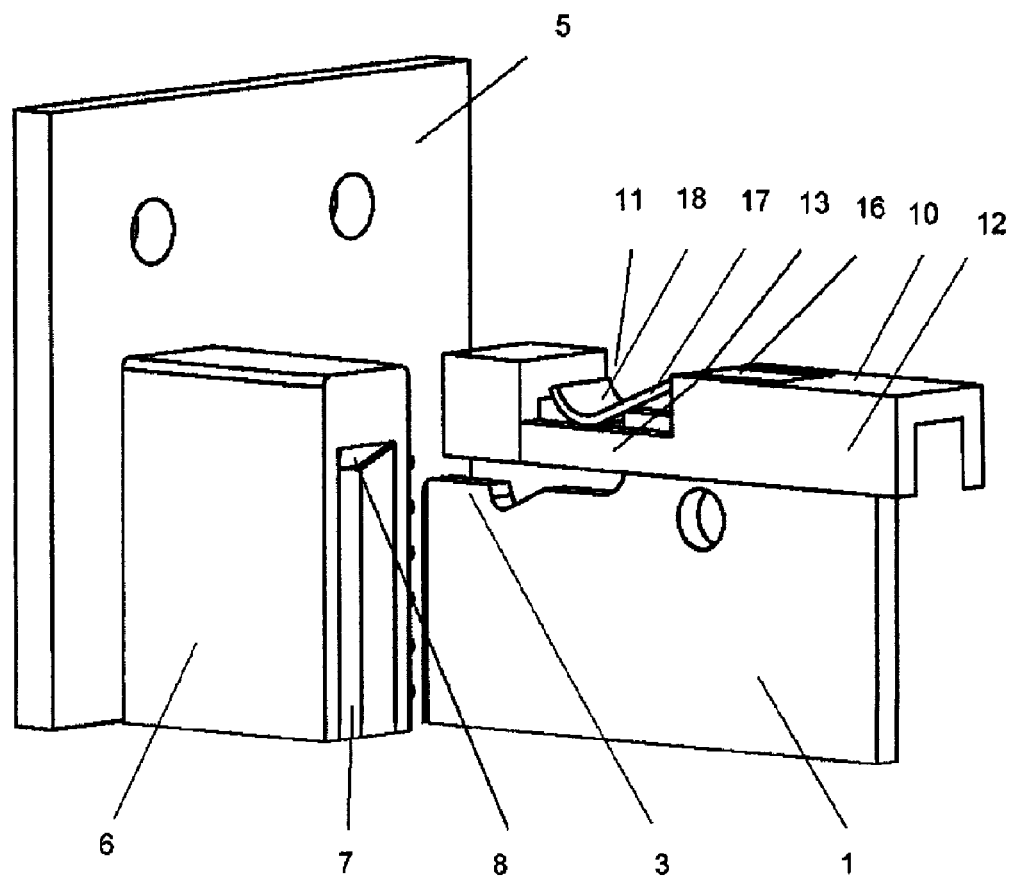
FIG. 2 shows a detail of FIG. 1 before the mating process.

In this case, the upper guide bar 10 features a cutout 11 that is illustrated in detail in FIG. 2 in the immediate vicinity of the edge connector 6.

A spring element 16 is arranged within the recess 11 that extends from the base of the U-shaped bar 10 into the lateral limbs 12, wherein the spring arm 17 of the spring element lies on the lateral limbs that are realized in the form of braces 13 in this case with its rounding 18. The recess is realized such that the rounding 18 of the spring arm 17 extends into the U-shaped cutout 11 of the guide bar.

A spring element 16 made of a metallic material is inserted into the upper guide bar 10 that is usually made of a plastic material or the spring element is shaped out of the material of the guide bar.

Figure 3:
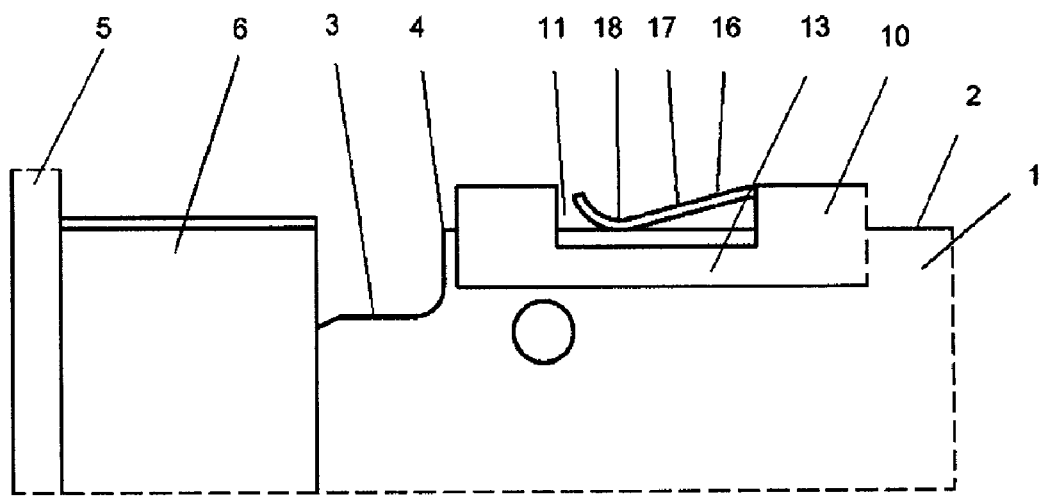
FIG. 3 shows a detail of FIG. 1 after the mating process.

According to FIG. 3, the circuit board 1 located in the upper guide bar 10 features a step 3 on its mating side, wherein the thusly tapered front section needs to be inserted into the mating slot 7 of the edge connector 6.

The spring arm 17 lies on the lateral braces 13 within the recess 11 until shortly before the circuit board is inserted into the edge connector, wherein the circuit board 1 that could previously be inserted between the guide bars 10, 14 with quite some vertical clearance is pressed against the lower guide bar 14 as soon as the edge 4 of the circuit board 1 reaches the rounding 18 of the spring arm 17.

However, the lower guide bar 14 is adapted to the strict tolerance referred to the lower edge 8' of the mating slot 7 in the edge connector 6 such that exact conformity between the electric contacts in the connector and the strip conductors arranged on the circuit board is ensured.

An additional improvement in locating the circuit board relative to the edge connector is achieved in that the circuit board is pressed against the lower edge 8' of the mating slot in the edge connector 6, wherein the lower mating slot edge 8' of the edge connector 6 is situated in a slightly elevated position referred to the lower guide bar 14 (with consideration of the variations in size of the circuit boards).

Figure 4A:
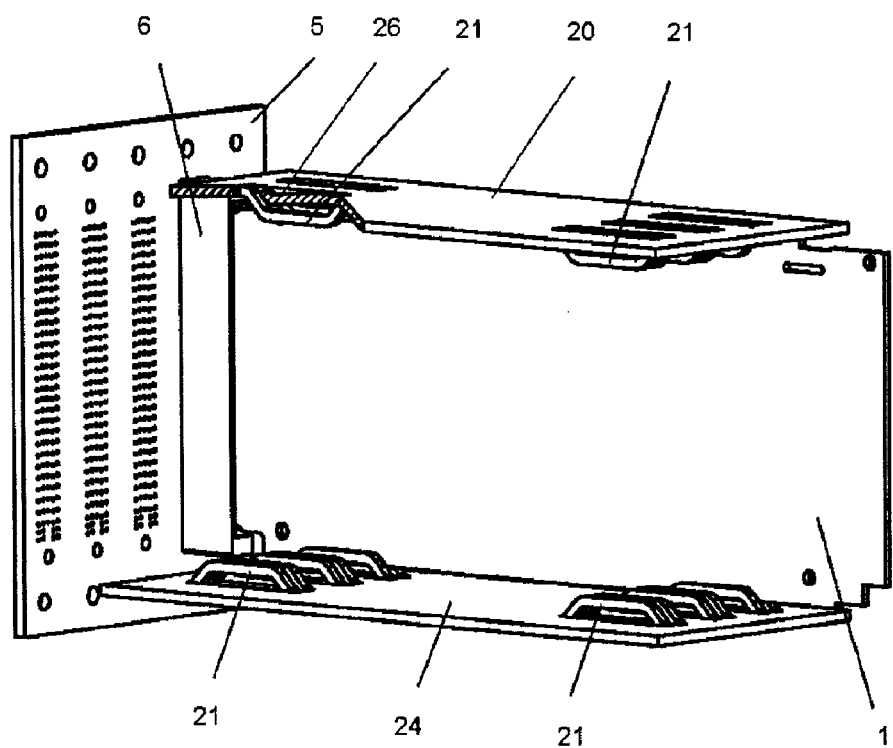
FIG. 4a shows an aspect of a circuit board that is inserted between a bottom plate and a cover plate.

FIG. 4a shows a section of a circuit board housing in which the circuit board is held in guide bars between a cover plate 20 and a bottom plate 24, wherein said guide bars are formed by locating braces 21 that are shaped out of the plate material in a handle-like fashion and point into the interior.

Two adjacent locating braces that are spaced apart from one another and arranged in the front and rear regions respectively form a guide bar for a circuit board 1 to be inserted therein.

Figure 4B:
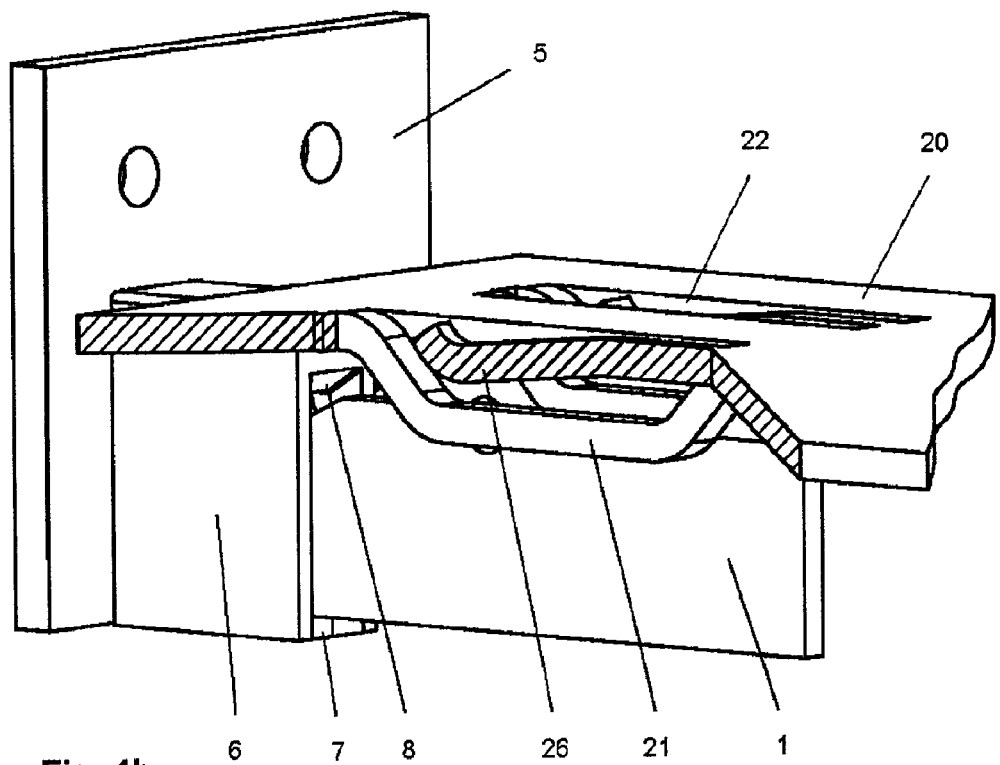

A spring element 26 acting upon the circuit board 1 is illustrated in FIG. 4b in the form of an enlarged partial section, wherein said spring element is shaped out of the material of the cover plate 20 and ensures that the circuit board 1 is pressed against the bottom plate 24.

Figure 5A:
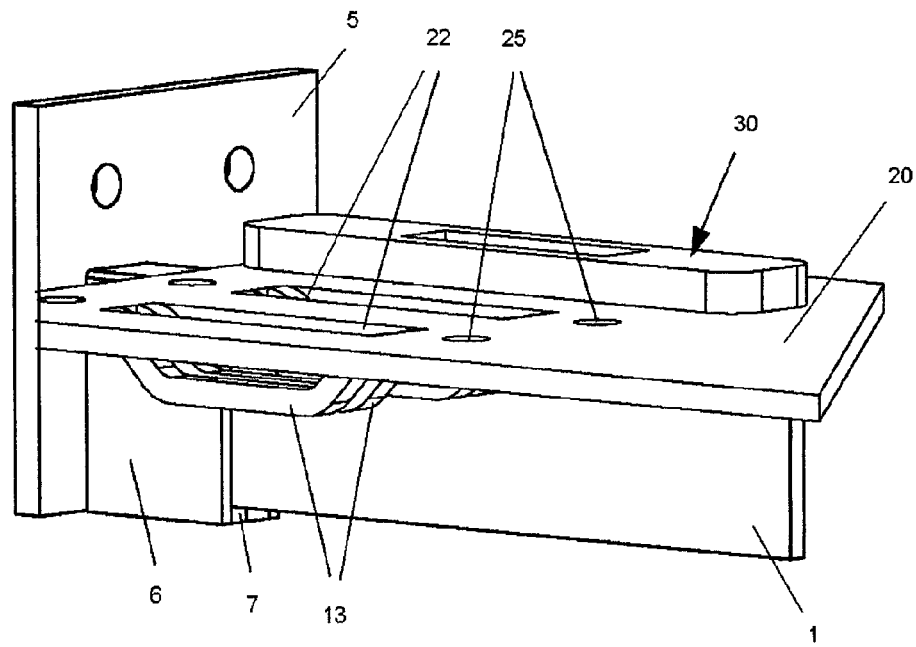
FIG. 5a shows an aspect of a separate spring element in a cover plate.

FIG. 5a shows a separate spring element 30 that can be subsequently installed and therefore is suitable for retrofitting applications in a cover plate that does not feature an integral spring element.

For this purpose, the spring element 30 is integrated into a plastic body 31 that is mounted in two openings 25 in the cover plate 20, wherein said openings consist of already provided standard openings or are produced subsequently.

Figure 5B:
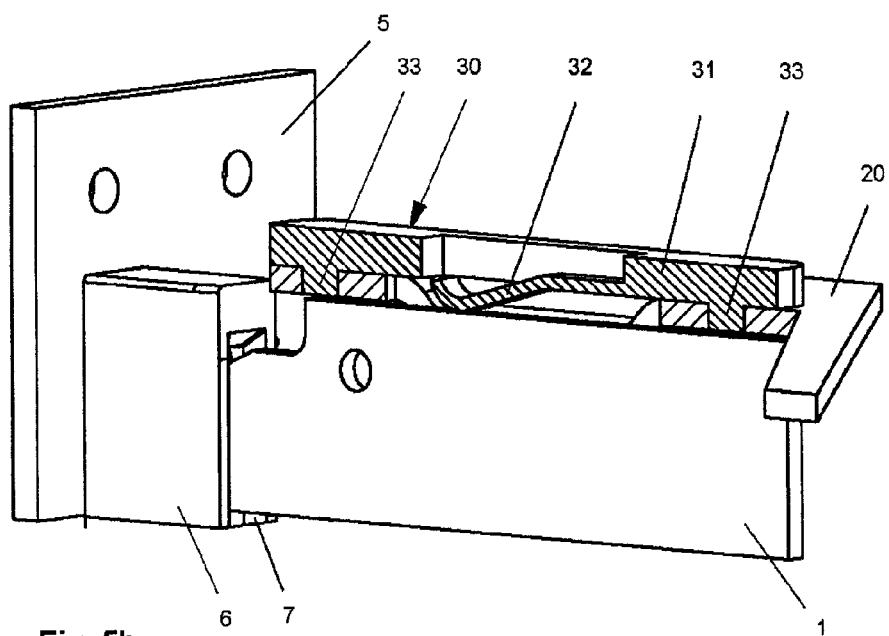
FIG. 5b shows a sectional representation of the spring element with an inserted card.

In this case, a spring arm 32 shaped out of the plastic body 31 penetrates into a cutout 22 that is formed by inwardly bent locating braces 21. This means that the spring arm acts upon the upper narrow side 2 of the circuit board 1 as shown in FIG. 5b.

The plastic body 31 of the separate spring element is snapped into the openings 25 provided or to be provided in the cover plate 20 by means of two integral plunger pins 33.

What is claimed is:

1. A pressure guide arranged in a circuit board housing, a printed circuit board comprising: a lower guide bar and an upper guide bar, wherein the printed circuit board is inserted between the two upper and lower guide bars for connecting one edge connector, and a spring element provided within one of the guide bars, wherein the upper and lower guide bars are realized in the form of locating braces that are arranged to both sides of the circuit board in a cover plate and a bottom plate of the circuit board housing surrounding the circuit board, wherein the spring element is arranged within the upper locating brace in the form of an integral element in a mating direction of the circuit board, wherein the spring element is arranged within a cutout in one of the guide bars, the cutout is formed opposite to a rail of each of the guide bars, the spring acting upon one narrow side of the circuit board when being inserted, and subjecting the printed circuit board to a pressure, parallel to a plane of the circuit board, that forces an opposing narrow side of the circuit board against the other guide bar when the printed circuit board is being inserted, thereby achieving precise contact between a plurality of strip conductors on a mating side of said printed circuit board and corresponding electric contacts arranged in a mating slot of an edge connector.

2. The pressure guide according to claim 1, wherein the spring element is arranged near a step of the inserted circuit board such that one of its sides always acts upon one narrow side of the circuit board.

3. The pressure guide according to claim 1, wherein the respective lower guide bar of the edge connector is adjusted to a minimal height tolerance relative to a lower edge of the mating slot.

4. The pressure guide according to claim 1, wherein the circuit board includes a step formed on side, and a lower edge of the mating slot in the edge connector is situated in an elevated position relative to the step on the side of the circuit board.

5. The pressure guide according to claim 1, wherein the spring element to be inserted separately is arranged within one of the locating braces provided in the cover plate.

6. The pressure guide according to claim 1, wherein the spring element is arranged within the upper locating brace in the form of a separate element in a mating direction of the circuit board.

7. The pressure guide according to claim 1, wherein the spring element is formed of a plastic material.

8. The pressure guide according to claim 1, wherein the spring element is formed of a metal and is inserted in a plastic body.

* * * * *